(12) United States Patent
Stabler et al.

(10) Patent No.: US 7,919,210 B2
(45) Date of Patent: Apr. 5, 2011

(54) THERMOELECTRIC AUGMENTED FUEL CELL SYSTEM

(75) Inventors: Francis R. Stabler, Troy, MI (US); Jihui Yang, Lakeshore (CA)

(73) Assignee: GM Global Technology Operations LLC, Detroit, MI (US)

(*) Notice: Subject to any disclaimer, the term of this patent is extended or adjusted under 35 U.S.C. 154(b) by 1420 days.

(21) Appl. No.: 10/961,868

(22) Filed: Oct. 8, 2004

(65) Prior Publication Data

US 2006/0003193 A1  Jan. 5, 2006

Related U.S. Application Data

(60) Provisional application No. 60/583,991, filed on Jun. 30, 2004.

(51) Int. Cl.
*H01M 8/04* (2006.01)
*H01M 8/00* (2006.01)

(52) U.S. Cl. ......... 429/440; 429/400; 429/428; 429/433

(58) Field of Classification Search ..................... None
See application file for complete search history.

(56) References Cited

U.S. PATENT DOCUMENTS

| | | | | |
|---|---|---|---|---|
| 5,314,762 A * | 5/1994 | Hamada et al. | ................. | 429/37 |
| 5,419,780 A * | 5/1995 | Suski | ............. | 136/205 |
| 5,678,410 A * | 10/1997 | Fujita et al. | ........................ | 62/7 |
| 5,753,383 A * | 5/1998 | Cargnelli et al. | ............. | 136/205 |
| 6,186,254 B1 * | 2/2001 | Mufford et al. | .............. | 180/65.3 |
| 6,368,737 B1 * | 4/2002 | Margiott et al. | ................ | 429/26 |
| 6,605,773 B2 * | 8/2003 | Kok et al. | ..................... | 136/242 |
| 2002/0053216 A1* | 5/2002 | Ap et al. | ..................... | 62/323.1 |
| 2002/0117198 A1* | 8/2002 | Kok et al. | ..................... | 136/205 |
| 2002/0177016 A1* | 11/2002 | Okamoto | ........................ | 429/20 |
| 2004/0101750 A1* | 5/2004 | Burch | ........................... | 429/200 |

* cited by examiner

*Primary Examiner* — Dah-Wei D Yuan
*Assistant Examiner* — Adam A Arciero
(74) *Attorney, Agent, or Firm* — Reising Ethington P.C.

(57) ABSTRACT

A thermoelectric augmented fuel cell system is disclosed. The system includes a fuel cell stack for generating electrical power and a thermoelectric unit provided in thermal contact with the fuel cell stack for receiving thermal energy from the fuel cell stack and generating additional electrical power.

18 Claims, 1 Drawing Sheet

THERMOELECTRIC AUGMENTED FUEL CELL SYSTEM

This application claims the benefit of a Provisional Application Ser. No. 60/583,991, filed Jun. 30, 2004.

FIELD OF THE INVENTION

The present invention relates to fuel cells which generate electricity to power vehicles or other machinery. More particularly, the present invention relates to a thermoelectric augmented fuel cell system in which waste or by-product thermal energy generated by various components in a fuel cell system are converted to electrical energy to augment the electrical supply of the fuel cell system and improve fuel cell efficiency.

BACKGROUND OF THE INVENTION

Recently, intensive efforts have been expended on fuel cell technology development due in large measure to fuel cell efficiency. Fuel cells have exhibited efficiencies as high as 55%. Furthermore, fuel cell power plants are environmentally friendly, emitting only heat and water as by-products.

Thermoelectric devices, which convert thermal energy into electrical energy, have the potential to augment the efficiency of primary electrical systems. Because they are relatively simple devices having no moving parts, thermoelectric devices are amenable to relatively low production costs in high volume and have a potential for high reliability. Depending on the particular thermoelectric technology selected, semiconductor technology and cost curves can be applied to thermoelectric technology implementation schemes to reduce costs considerably.

Accordingly, a thermoelectric augmented fuel cell system is needed which imparts improved fuel efficiency to a fuel cell system by generating the same quantity of electrical energy as that generated by a non-augmented system while using less fuel for the purpose. Furthermore, a thermoelectric augmented fuel cell system is needed which is capable of increasing the electrical output of a fuel cell system without requiring additional fuel.

SUMMARY OF THE INVENTION

The present invention is generally directed to a thermoelectric augmented fuel cell system which is capable of using waste thermal energy generated by various components of a stationary or mobile fuel cell to generate electrical power and increase the efficiency of the fuel cell. In a typical embodiment, the system includes a thermoelectric unit, the hot side of which is provided in thermal contact with heated coolant from a fuel cell stack. A fan or other source of flowing air is provided in thermal contact with the cold or heat sink side of the thermoelectric unit. An electric power control system is operably connected to the thermoelectric unit to receive electrical current generated by the thermoelectric unit. The electric power control system includes the capability of matching the electrical power output of the thermoelectric unit to the electrical power requirement of electrical systems powered by the fuel cell. Under typical operating conditions, the electrical power output of the fuel cell is correspondingly reduced by the quantity of electrical power provided by the thermoelectric unit in order to maintain the electrical power required by the electrical systems powered by the fuel cell without expending unnecessary fuel. Under conditions of maximum electric power demand, the thermoelectric unit augments the electrical power output of the fuel cell to increase the total electrical power available to the electrical systems powered by the fuel cell. A battery may be connected to the electric power control system for the storage of surplus electrical power when electrical power from the thermoelectric unit exceeds the electrical requirements of the electrical systems powered by the fuel cell.

BRIEF DESCRIPTION OF THE DRAWING

The invention will now be described, by way of example, with reference to the accompanying drawing, in which.

DETAILED DESCRIPTION OF THE INVENTION

Figure 1:
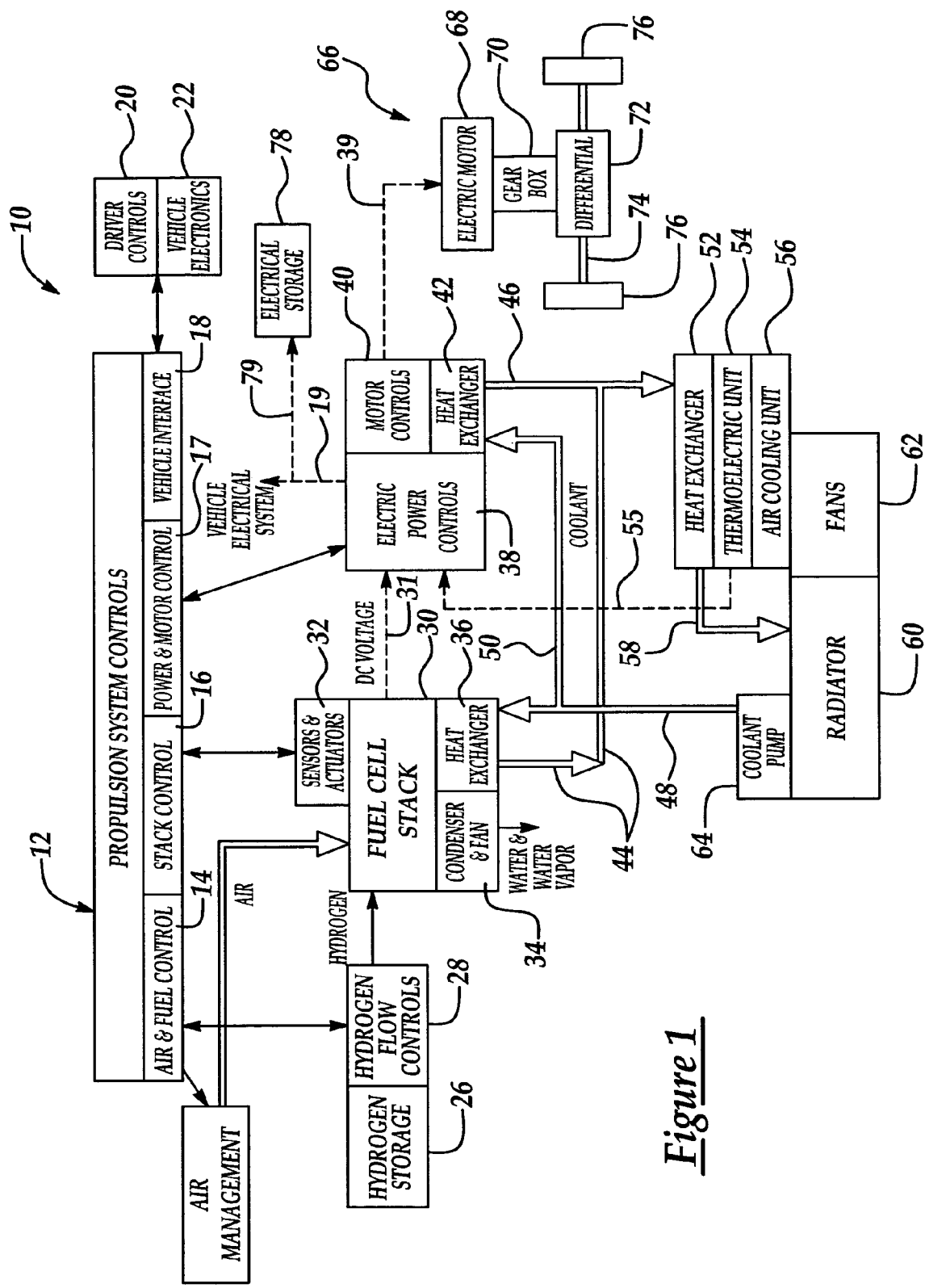
FIG. 1 is a schematic diagram of an exemplary embodiment of the thermoelectric augmented fuel cell system of the present invention.

Referring to FIG. 1 of the drawing, an exemplary embodiment of the thermoelectric augmented fuel cell system of the present invention, hereinafter system, is generally indicated by reference numeral 10. The system 10 is shown in the drawing as a component part of a PEM (polymer electrolyte membrane) fuel cell vehicle 66. However, it will be understood that the system 10 is not limited to use in a fuel cell vehicle but may be used in any mobile or stationary application in which a fuel cell generates electrical power for electrical systems. Furthermore, the invention is not limited to use with PEM fuel cells but may be used with other types of fuel cells.

As will be hereinafter described, the system 10 of the present invention is capable of using a thermoelectric device or devices to convert waste heat from a fuel cell and its associated hardware into electrical power which augments the efficiency of a fuel cell vehicle or stationary fuel cell electrical power generator. As used herein, thermoelectric devices are any material or devices that can use a temperature differential to produce electrical power without mechanical motion. The invention includes but is not limited to using waste heat captured from the particular components discussed herein, but may be applicable to harvesting any thermal energy which is available after the fuel cell and associated hardware have performed their normal function, such as, but not limited to, heat in the exhaust gases and liquid coolant from the fuel cell stack or electrical power controls. Furthermore, the invention is applicable to any fuel cell generator or vehicle system that uses a fuel cell as its primary source of electrical power.

The system 10 may include propulsion system controls 12 having an air and fuel control component 14, a stack control component 16, a power and motor control component 17 and a vehicle interface component 18. The stack control component 16 interfaces with the various sensors and actuators 32 of a fuel cell stack 30 to control the fuel cell stack 30 during operation of the fuel cell vehicle 66. The vehicle interface component 18 interfaces with the driver controls 20 and vehicle electronics 22 of the fuel cell vehicle 66.

The air and fuel control component 14 facilitates air management and interfaces with a hydrogen flow control system 28 which communicates with a hydrogen storage module 26. Through the air and fuel control component 14, the hydrogen flow control system 28 controls the delivery of hydrogen fuel from the hydrogen storage module 26 into the hydrogen inlet of the fuel cell stack 30.

The power and motor control module 17 interfaces with electric power controls 38 which, through a motor control module 40, are electrically connected to an electric motor 68 of the fuel cell vehicle 66 via wiring 39. In the fuel cell vehicle 66, a gear box 70 typically couples the electric motor 68 to a differential 72 that is geared to an axle 74 having wheels 76. The electric power controls 38 are further electrically connected to the driver controls 20 and vehicle electronics 22, via wiring 19, through the vehicle interface 18. An electrical storage system 78, such as a battery, may be electrically connected to the electric power controls 38 via wiring 79 for purposes which will be hereinafter described. The fuel cell stack 30 is electrically connected to the electric power controls 38 through suitable wiring 31 to transfer electrical power generated by the fuel cell stack 30 to the electric power controls 38.

A condenser and fan unit 34 is provided at the cathode outlet of the fuel cell stack 30 for the emission of by-product water during operation of the fuel cell stack 30. A fuel cell heat exchanger 36 is provided in thermal contact with the fuel cell stack 30 for facilitating thermal exchange between the fuel cell stack 30 and liquid coolant. A coolant outlet line 44 extends from the fuel cell heat exchanger 36 for distributing the heated coolant from the fuel cell stack 30. The coolant outlet line 44 may be connected to a coolant outlet line 46 which extends from an electric power control heat exchanger 42 provided in thermal contact with the electric power control 38.

A radiator 60 includes a coolant pump 64 which is connected to the fuel cell heat exchanger 36 through a coolant return line 48. A coolant return line 50 extends from the coolant return line 48 and is provided in fluid communication with the electric power control heat exchanger 42. The coolant outlet line 46 extends from the electric power control heat exchanger 42 and is connected to a thermoelectric unit heat exchanger 52, which is provided in thermal contact with the hot side of a thermoelectric unit 54. A coolant outlet line 58 connects the thermoelectric unit heat exchanger 52 to the radiator 60. Wiring 55 connects the thermoelectric unit 54 to the electric power controls 38 to transmit electrical power generated by the thermoelectric unit 54 to the electric power controls 38, as will be hereinafter further described.

An air cooling unit 56 is provided in thermal contact with the cool or heat sink side of the thermoelectric unit 54. A fan or fans 62 may be provided in thermal contact with the air cooling unit 56 to generate an air stream which cools the cool side of the thermoelectric unit 54. Alternatively, the air cooling unit 56 may be adapted to receive flowing ambient air resulting from forward movement of the fuel cell vehicle 66.

In operation of the system 10, by actuation of the air and fuel control component 14 of the propulsion system controls 12, the hydrogen flow control system 28 facilitates flow of hydrogen from the hydrogen storage module 26 to the fuel cell stack 30. By-product water and water vapor is emitted from the fuel cell stack 30 by the condenser and fan unit 34. Electrical power generated by the fuel cell stack 30 is transmitted to the electric power controls 38 through the wiring 31. Through the motor controls 40, the electric power controls 38 in turn transmit electrical power to the electric motor 68 of the fuel cell vehicle 66 via the wiring 39. The electric motor 68 operably engages the differential 72 through the gear box 70. The differential 72 transmits torsion to the wheels 76 through the axle 74, propelling the fuel cell vehicle 66 typically in conventional fashion. Additional electrical power is transmitted from the electrical power controls 38 to the vehicle electrical systems, such as vehicle interface 18, driver controls 20 and vehicle electronics 22 through the wiring 19.

The fuel cell stack 30 operates at temperatures of typically about 70 to 120 degrees C. Moreover, the electric power controls 38 operate at a relatively high temperature due to internal electrical resistance. The waste thermal energy generated by the fuel cell stack 30 and electric power controls 38 is converted into electrical energy to enhance fuel efficiency of the fuel cell stack 30, as well as increase performance of the fuel cell stack 30 during periods of high electrical power demand, as will be hereinafter described.

During operation of the fuel cell stack 30 and electric power controls 38, coolant is distributed from the coolant pump 64 of the radiator 60, through the coolant return line 48 and into the fuel cell heat exchanger 36. Simultaneously, coolant is distributed from the coolant return line 48, through the coolant return line 50 and into the electric power control heat exchanger 42. In the fuel cell heat exchanger 36, thermal energy is transferred from the fuel cell stack 30 to the flowing coolant. The heated coolant is distributed from the fuel cell heat exchanger 36, through the coolant outlet line 44. Simultaneously, in the electric power control heat exchanger 42, thermal energy is transferred from the electric power controls 38 to the flowing coolant. The heated coolant flows from the electric power control heat exchanger 42 through the coolant outlet line 46, where the coolant mixes with the heated coolant from the coolant outlet line 44. The heated coolant from both the fuel cell heat exchanger 36 and the electric power control heat exchanger 42 is distributed by the coolant outlet line 46 into the thermoelectric unit heat exchanger 52.

As the heated coolant flows into the thermoelectric unit heat exchanger 52 at the hot side of the common thermoelectric unit 54, the fan or fans 62 direct a flow of air into the air cooling unit 56 at the cold or heat sink side of the thermoelectric unit 54. Accordingly, thermal energy is transferred from the heated coolant to the hot side of the thermoelectric unit 54. Consequently, a thermal gradient is established between the hot side and the cold side of the thermoelectric unit 54. Responsive to this thermal gradient, the thermoelectric unit 54 generates an electrical current which is transmitted to the electric power controls 38 through the wiring 55. The expended coolant flows from the thermoelectric unit heat exchanger 52 to the radiator 60 through the coolant outlet line 58. At the radiator 60, thermal exchange is conducted between the coolant and air flowing through the radiator 60 to dissipate the remaining heat from the coolant. The coolant is then distributed by the coolant pump 64 back to the fuel cell heat exchanger 36 through the coolant return line 48 and to the electric power control heat exchanger 42 through the coolant return line 50 and the cycle is repeated.

The temperature differential between the hot and cold sides of the thermoelectric unit heat exchanger 52, as well as the characteristics of the thermoelectric unit 54, defines the magnitude of electrical power transmitted from the thermoelectric unit 54 to the electric power controls 38. The electric power controls 38 include the capability to match the electrical power output from the thermoelectric unit 54 to the electric motor 68 and other electrical systems powered by the fuel cell stack 30 through the electric power controls 38.

The thermoelectric unit 54 enhances fuel efficiency of the fuel cell stack 30 during normal operating conditions, as well as increases performance of the fuel cell stack 30 during periods of high electrical power demand. Under normal operating conditions, the electrical power output of the fuel cell stack 30 will have to be reduced by the quantity of electrical power provided by the thermoelectric unit 54 in order to maintain control of the electrical power supplied to the electric motor 68 and electrical system of the fuel cell vehicle 66. Because reduced electrical power from the fuel cell stack 30 results in a corresponding reduction in the waste heat available from the fuel cell heat exchanger 36, and therefore, a reduction in the quantity of electrical power available for augmentation of the fuel cell stack 30, the electric power controls 38 must include an adaptive control system to account for the interaction between the thermoelectric unit 54 and the fuel cell stack 30. Surplus electrical power generated by the thermoelectric unit 54 during normal operating conditions of the fuel cell stack 30 is stored in the electrical storage system 78.

Under conditions of maximum electrical power demands placed on the system 10 by the electric motor 68 and vehicle electrical system, the thermoelectric unit 54 augments the electrical output of the fuel cell stack 30 to increase the total power available to the electric motor 68 and vehicle electrical system. Furthermore, the electrical storage 78 can serve as a reservoir of electrical power to operate the electric motor 68 and vehicle electrical system during conditions of maximum electrical power demand.

While the preferred embodiments of the invention have been described above, it will be recognized and understood that various modifications can be made in the invention and the appended claims are intended to cover all such modifications which may fall within the spirit and scope of the invention.

What is claimed is:

1. A thermoelectric augmented fuel cell system, comprising:
    a fuel cell stack for generating electrical power;
    electric power controls electrically connected to said fuel cell stack for receiving electrical power from said fuel cell stack and powering an electric load; and
    a common thermoelectric unit provided in thermal contact with said fuel cell stack and with said electric power controls for receiving thermal energy from said fuel cell stack and from said electric power controls and generating additional electrical power to said electric power controls, wherein in a normal operating condition said electric power controls match the electrical power output from said fuel cell stack and from said thermoelectric unit with respect to the electrical power requirement of the electric load by reducing the electrical power generated by said fuel cell stack by the quantity of the additional electrical power generated by said thermoelectric unit.

2. The system of claim 1 further comprising an electrical storage system electrically connected to said thermoelectric unit for storing said additional electrical power.

3. The system of claim 1 further comprising an air cooling unit provided in thermal contact with said thermoelectric unit for directing a stream of air against said thermoelectric unit.

4. The system of claim 3 further comprising at least one fan provided adjacent to said air cooling unit for generating said stream of air.

5. The system of claim 1 further comprising a coolant outlet line extending between said fuel cell stack and said thermoelectric unit for directing heated coolant from said fuel cell stack to said thermoelectric unit.

6. The system of claim 5 further comprising a radiator, a coolant outlet line extending between said thermoelectric unit and said radiator for distributing the coolant from said thermoelectric unit to said radiator, a coolant pump provided in fluid communication with said radiator, and a coolant return line extending between said coolant pump and said fuel cell stack for distributing coolant from said radiator to said fuel cell stack.

7. The system of claim 6 further comprising an air cooling unit provided in thermal contact with said thermoelectric unit for directing a stream of air against said thermoelectric unit.

8. The system of claim 7 further comprising at least one fan provided adjacent to said, air cooling unit and said radiator for generating said stream of air.

9. A thermoelectric augmented fuel cell system for a fuel cell vehicle, comprising:
    a fuel cell stack for generating electrical power for an electric vehicle motor and vehicle electrical system;
    electric power controls electrically connected to said fuel cell stack for receiving electrical power from said fuel cell stack and powering the electric vehicle motor and vehicle electrical system;
    a common thermoelectric unit provided in thermal contract with aid fuel cell stack and with said electric power controls for receiving thermal energy from said fuel cell stack and from said electric power controls and generating additional electrical power to said electric power controls;
    said electric power controls including an adaptive control to control the electrical power output from said fuel cell stack and from said thermoelectric unit based on a reduction in thermal energy available to said thermoelectric unit form said fuel cell stack as a result of reduced electrical power generated by said fuel cell stack.

10. The system of claim 9 wherein said electric power controls are electrically connected to said thermoelectric unit for receiving the additional electrical power from said thermoelectric unit.

11. The system of claim 10 further comprising an electrical storage system electrically connected to said electric power controls for storing said additional electrical power.

12. The system of claim 9 further comprising an air cooling unit provided in thermal contact with said thermoelectric unit for directing a stream of air against said thermoelectric unit.

13. The system of claim 12 further comprising at least one fan provided adjacent to said air cooling unit for generating said stream of air.

14. The system of claim 9 further comprising a coolant outlet line extending between said fuel cell stack and said thermoelectric unit for directing heated coolant from said fuel cell stack to said thermoelectric unit.

15. The system of claim 14 further comprising a second coolant outlet line extending between said electric power controls and said thermoelectric unit for directing heated coolant from said electric power controls to said thermoelectric unit.

16. The system of claim 15 further comprising a radiator, a coolant outlet line extending between said thermoelectric unit and said radiator for distributing the coolant from said thermoelectric unit to said radiator, a coolant pump provided in fluid communication with said radiator, and a coolant return line extending between said coolant pump and said fuel cell stack and between said coolant pump and said electric power controls for distributing coolant from said radiator to said fuel cell stack and said electric power controls, respectively.

17. A method of augmenting electrical power in a fuel cell system, comprising:
    providing a fuel cell stack and electric power controls for said fuel cell stack;
    generating electrical power by operating said fuel cell stack;
    capturing thermal energy from said fuel cell stack and said electric power controls;
    converting said thermal energy from said fuel cell stack and said electric power controls in a common thermoelectric unit into additional electrical power which is then provided to said electric power controls; and matching the electrical power output from said fuel cell stack and from said thermoelectric unit with respect to the electrical power requirement in a normal operating condition by reducing the electrical power generated by said fuel cell stack by the quantity of the additional electrical power generated by said thermoelectric unit.

18. The method of claim 17 further comprising storing said additional electrical energy.

* * * * *